(12) United States Patent
Ito

(10) Patent No.: US 10,436,479 B2
(45) Date of Patent: Oct. 8, 2019

(54) FIXTURE FOR SOLAR CELL MODULE

(71) Applicant: Solar Frontier K.K., Tokyo (JP)

(72) Inventor: Daisuke Ito, Tokyo (JP)

(73) Assignee: Solar Frontier K.K., Tokyo (JP)

( * ) Notice: Subject to any disclaimer, the term of this patent is extended or adjusted under 35 U.S.C. 154(b) by 0 days.

(21) Appl. No.: 16/071,019

(22) PCT Filed: Jan. 19, 2017

(86) PCT No.: PCT/JP2017/001811
§ 371 (c)(1),
(2) Date: Jul. 18, 2018

(87) PCT Pub. No.: WO2017/126630
PCT Pub. Date: Jul. 27, 2017

(65) Prior Publication Data
US 2019/0032964 A1    Jan. 31, 2019

(30) Foreign Application Priority Data

Jan. 19, 2016  (JP) ................................ 2016-008216

(51) Int. Cl.
*E04D 13/18*    (2018.01)
*F24S 25/63*    (2018.01)
(Continued)

(52) U.S. Cl.
CPC ............. *F24S 25/63* (2018.05); *F24S 25/20* (2018.05); *H01L 31/0475* (2014.12); *H02S 20/24* (2014.12); *Y02B 10/12* (2013.01)

(58) Field of Classification Search
CPC ....... F24S 25/63; F24S 25/20; H01L 31/0475; H02S 20/10; H02S 20/24; Y02B 10/12
(Continued)

(56) References Cited

U.S. PATENT DOCUMENTS 4,263,896 A * 4/1981 Zebuhr ................... F24S 10/73
126/623
5,076,035 A * 12/1991 Wright ..................... E04B 2/96
52/464

(Continued)

FOREIGN PATENT DOCUMENTS

JP    2002-167927    6/2002
JP    2013-144917    7/2013
(Continued)

*Primary Examiner* — Basil S Katcheves
(74) *Attorney, Agent, or Firm* — Morrison & Foerster LLP

(57) ABSTRACT

A fixture which fixes a solar cell module to a rail member for supporting the solar cell module is provided with: a side section that abuts a side surface of the solar cell module intersecting a light-receiving surface of the solar cell module; an upper section that extends from the upper end of the side section so as to face the light-receiving surface of the solar cell module; a lower section that extends from the lower end of the side section so as to face the lower surface, of the solar cell module, on the opposite side to the light-receiving surface of the solar cell module; and a fixing section that is fixed to a side section of the rail member. The fixing section extends downward from a position on the lower section that is away from a connecting part between the side section and the lower section.

7 Claims, 5 Drawing Sheets

(51) Int. Cl.
*H02S 20/24* (2014.01)
*H01L 31/0475* (2014.01)
*F24S 25/20* (2018.01)

(58) Field of Classification Search
USPC ..................................................... 52/173.3
See application file for complete search history.

(56) References Cited

U.S. PATENT DOCUMENTS

| | | | | |
|---|---|---|---|---|
| 5,524,401 A * | 6/1996 | Ishikawa | ................... | E04D 1/30 52/173.3 |
| 5,678,383 A * | 10/1997 | Danielewicz | ............. | E04D 3/06 52/235 |
| 6,105,317 A * | 8/2000 | Tomiuchi | ................. | E04D 3/08 52/173.3 |
| 6,111,189 A * | 8/2000 | Garvison | .......... | H01L 31/02008 136/244 |
| 6,617,507 B2 * | 9/2003 | Mapes | .................... | H02S 20/10 136/251 |
| 6,959,517 B2 * | 11/2005 | Poddany | ............... | E06B 1/6015 52/173.3 |
| 7,915,519 B2 * | 3/2011 | Kobayashi | ............. | F24J 2/5211 126/623 |
| 8,141,306 B2 * | 3/2012 | Masuda | ................... | H02S 20/23 52/173.3 |
| 8,950,721 B2 * | 2/2015 | Kobayashi | ............. | F16M 13/02 248/500 |
| 9,093,584 B2 * | 7/2015 | Kanbara | ................. | H01L 31/042 |
| 9,518,596 B2 * | 12/2016 | West | ........................ | H02S 20/23 |
| 9,982,435 B2 * | 5/2018 | Miller | ........................ | E04D 3/08 |
| 2003/0070368 A1 * | 4/2003 | Shingleton | ............. | F24J 2/5205 52/173.3 |
| 2006/0118163 A1 * | 6/2006 | Plaisted | ................... | H02S 20/23 136/251 |
| 2011/0000519 A1 * | 1/2011 | West | ........................ | H02S 20/23 136/244 |
| 2015/0288320 A1 * | 10/2015 | Stearns | ................... | H02S 20/23 52/173.3 |
| 2016/0126884 A1 * | 5/2016 | Stearns | ................... | H02S 20/23 52/173.3 |
| 2016/0142006 A1 * | 5/2016 | Meine | ..................... | H02S 20/23 174/535 |

FOREIGN PATENT DOCUMENTS

JP 2013-189761 9/2013
JP 2014-47593 3/2014

* cited by examiner

FIXTURE FOR SOLAR CELL MODULE

CROSS REFERENCE TO RELATED APPLICATION

This application is a U.S. National phase patent application of International Patent Application No. PCT/JP2017/001811, filed Jan. 19, 2017, which claims priority of Japanese Patent Application No. JP 2016-008216, filed Jan. 19, 2016, the contents of which are hereby incorporated by reference in the present disclosure in its entirety.

FIELD OF THE INVENTION

The present invention relates to a fixture for fixing a solar cell module.

BACKGROUND OF THE INVENTION

Solar cell modules installed on a roof of a building or on the ground are generally supported by and fixed to a stand. The stand may have long metal shaped members for supporting the solar cell modules at their back surface sides (hereinafter, referred to as "rail members"), support legs supporting these rail members from the installation surface, and fixtures for fixing the solar cell modules to the rail members. One example of such a stand is described in PTL 1. In the stand disclosed in PTL 1, a plurality of lip channel-shaped rail members extending in a direction perpendicular to the slanted direction of the roof are arranged at equal intervals along the slanted direction and are fixed to support legs (mounting fittings) fixed to the roof. Further, solar cell modules are fixed to the rail members by fixtures (fastening plate members).

PATENT LITERATURE

PTL 1: Japanese Patent Publication No. 2014-47593A

BRIEF SUMMARY OF THE INVENTION

Rainwater falling on the surface of a solar cell module concentratedly flows off from the downflow end side of the solar cell module since the solar cell module is slanted. In the case of the stand shown in PTL 1, the rainwater flowing off from the downflow end side of the solar cell module drops onto the rail member which partially protrudes beyond the downflow end side of the module. That is, the rail member receives not only the rain falling directly onto it, but also the rainwater flowing off from the solar cell module. For this reason, in the case of the stand of PTL 1, corrosion of rail members and accelerated deterioration due to the same are a concern. The present invention is made in consideration of the problem of the prior art explained above and has as its object to provide a fixture of a solar cell module suppressing corrosion of rail members of the stand of the solar cell module.

To achieve the above-mentioned object, according to the present invention, there is provided a fixture for fixing a solar cell module to a rail member for supporting the solar cell module, the fixture comprises a side section abutting against a side surface of the solar cell module perpendicular to a light-receiving surface of the solar cell module, an upper section extending from a top end of the side section so as to face the light-receiving surface of the solar cell module, a lower section extending from a bottom end of the side section so as to face a bottom surface of the solar cell module at an opposite side to the light-receiving surface of the solar cell module, and a fixing section to be fixed to a side section of the rail member, the fixing section extending downward from a position of the lower section away from a part where the side section and the lower section are joined so that the side surface of the solar cell module protrudes further than the side section of the rail member.

If using the fixture according to the present invention to fix a solar cell module to a rail member, the rail member is hidden under the solar cell module and cannot be seen from above. For this reason, rain falling from above will not wet the rail member. Further, rainwater falling on the light-receiving surface of the solar cell module drops down along the outside surface of the side section of the fixture from the downflow end of the solar cell module standardly given a slant, but the side section of the fixture protrudes to the outside more than the rail member, so the rail member is almost entirely not wet. As a result, corrosion of the rail member is suppressed and the durability and lifetime of the rail member can be improved.

DETAILED DESCRIPTION OF THE INVENTION

Figure 1:
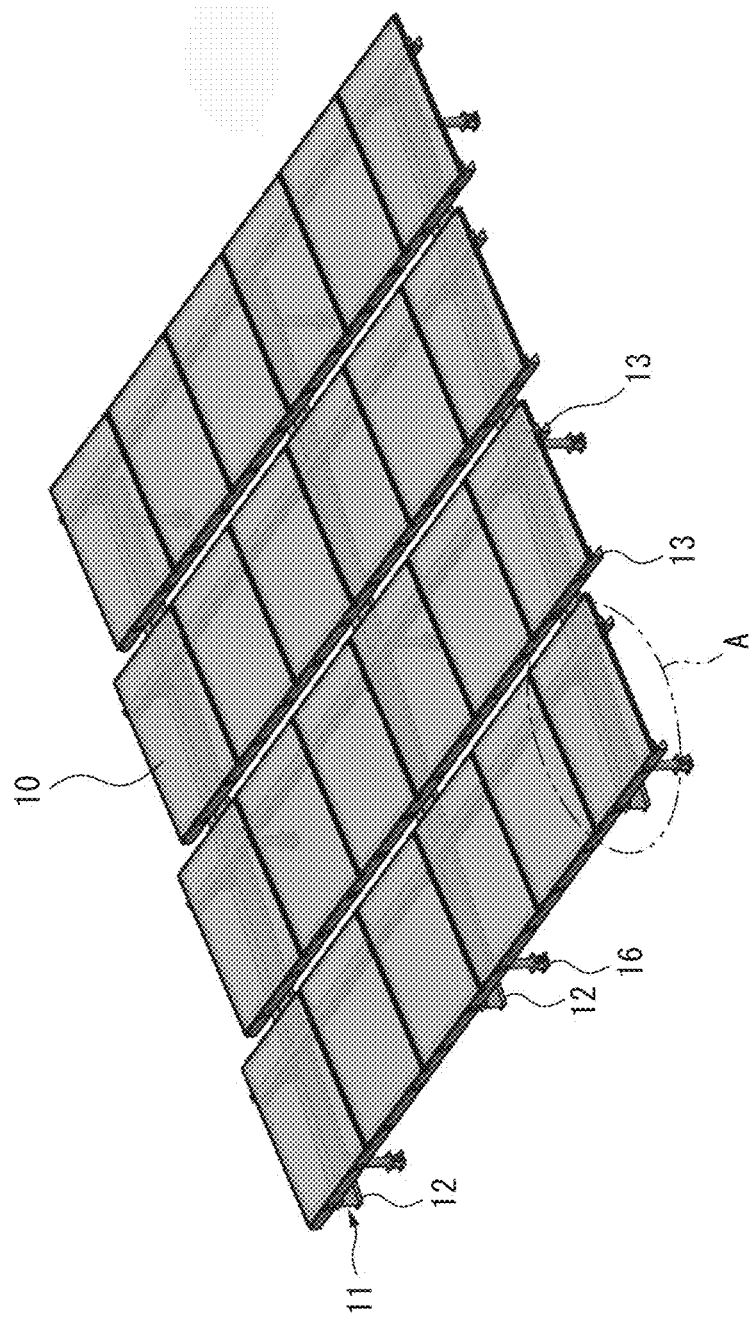
FIG. 1 is a perspective view showing an example of using fixtures according to a first embodiment of the present invention to attach solar cell modules to a stand.
Figure 2:
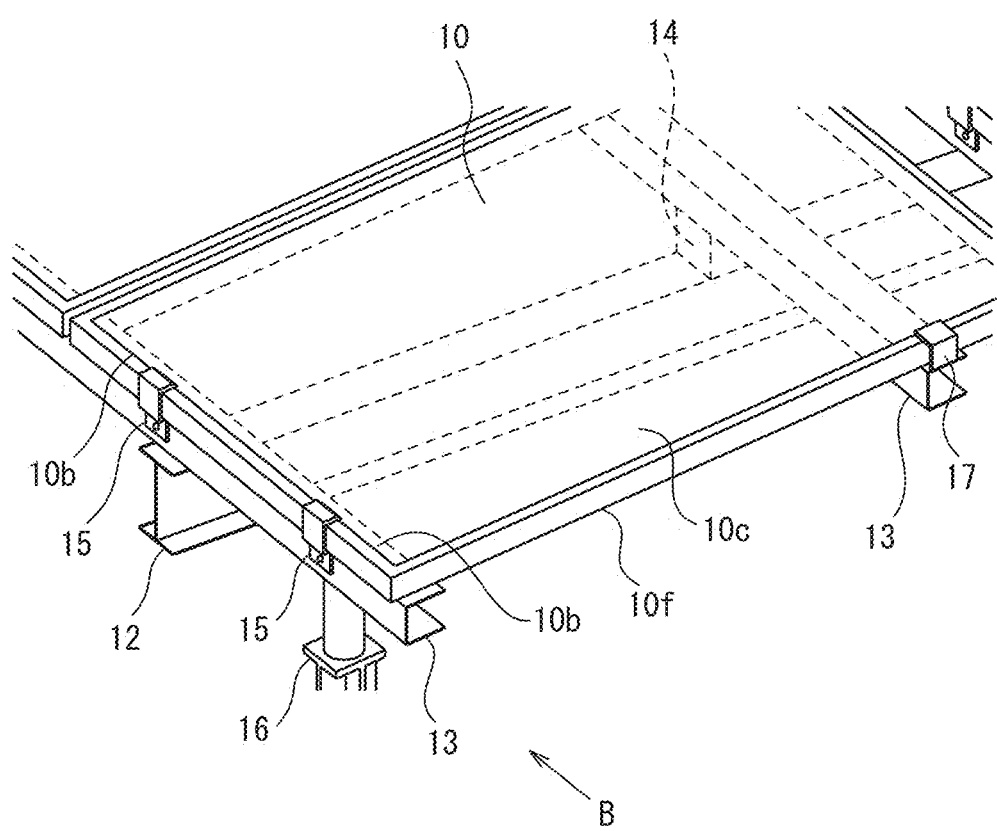
FIG. 2 is an enlarged view of a part A of FIG. 1.
Figure 3:
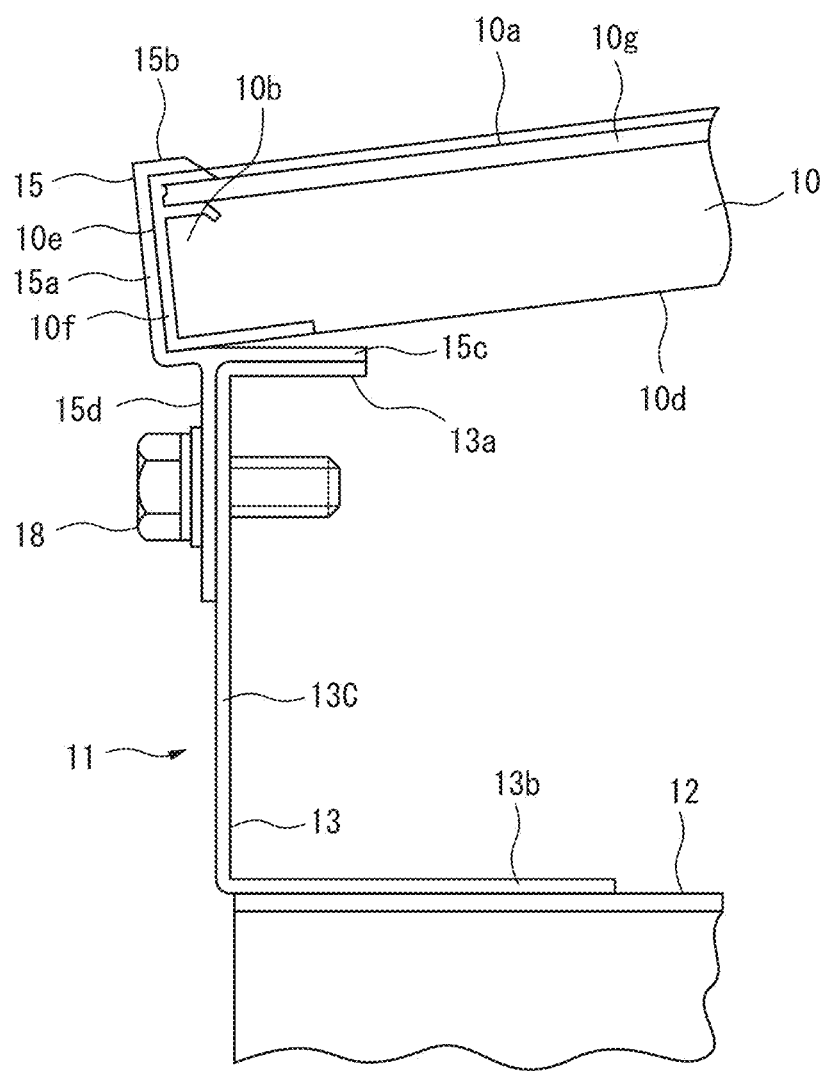
FIG. 3 is a side view showing the state where a fixture according to the first embodiment of the present invention is used to attach a solar cell module to a horizontal rail member of a stand.

FIG. 1 is a perspective view showing an example where a plurality of solar cell modules 10 are supported by a stand 11 and installed on a roof or ground or other installation surface (not shown). FIG. 2 is an enlarged view of a part A of FIG. 1. FIG. 3 is a side view of a solar cell module 10 and the stand 11 seen in the direction of the arrow B of FIG. 2. In FIG. 1, four rows of solar cell modules, each row having six solar cell modules arranged adjoining each other along the short side directions of the solar cell modules, are arranged on the stand 11. The solar cell modules 10 of FIG. 1 are given slants of angles of for example about 10 degrees from the horizontal plane so that the short sides at the left side of FIG. 1 become the downflow sides. Note that, FIG. 1 is drawn as a semitransparent view for showing in an easily understandable manner the configuration of the stand 11 placed under the solar cell modules 10.

The solar cell module 10 illustrated in the Description has a rectangular solar cell panel 10g and a frame 10f holding the peripheral ends of the same.

The stand 11 illustrated in FIG. 1 for supporting the solar cell modules 10 have three vertical rail members 12, support legs 16, eight horizontal rail members 13, spacers 14, first fixtures 15, second fixtures 17, and not shown third fixtures. The vertical rail members 12 extend in the slanted direction of the solar cell modules 10 (long side directions of solar cell modules). The support legs 16 support the vertical rail members 12 on the installation surface. The horizontal rail members 13 are arranged above the vertical rail members 12 to perpendicularly intersect the vertical rail members 12. The solar cell modules 10 are fixed to two horizontal rail members 13. The spacers 14 are arranged between the vertical rail members 12 and one of the horizontal rail members 13 for giving a slant to the solar cell modules 10. The first fixtures 15 fix the solar cell modules 10 to the horizontal rail members 13 at the downflow short side ends 10b. The second fixtures 17 fix the long side ends 10c at the outsides of the solar cell modules 10 arranged at the two ends of the rows to the upflow side horizontal rail members 13. The not shown third fixtures are arranged between each two solar cell modules adjoining each other in the horizontal direction (short side directions of solar cell modules) and fix the long side ends 10c of the two solar cell modules 10 to the horizontal rail members 13.

One solar cell module 10, in the example of FIG. 1, is fixed at the downflow short side end 10b by two first fixtures 15 to one horizontal rail member 13 and is fixed at the long side end 10c near the upflow short side end 10b by the second fixtures 17 or the third fixtures (not shown) to other horizontal rail members 13. Further, in the example of FIG. 1, the vertical rail members 12 are formed from I-shaped steel, while the horizontal rail members 13 are formed from channel steel. The channel steel of the horizontal rail member 13 has two horizontal extending sections 13a, 13b extending horizontally facing each other in parallel and a side section 13c extending perpendicular to these horizontal extending sections and connecting the same. The horizontal rail members 13 illustrated in FIG. 1 to FIG. 3 are arranged so that their side sections 13c are vertical.

A second fixture 17, while details are not shown, has for example a section contacting the light-receiving surface of the solar cell module 10, a section to be fixed to a horizontal rail, and a section connecting the two sections and has a substantially Z-shaped cross-section. A third fixture, while not shown, for example, has an inverted hat-shaped cross-section and is fixed to a horizontal rail so as to press down the light-receiving surfaces of two adjoining solar cell modules 10.

The first fixture 15 for fixing the downflow short side end 10b of the solar cell module 10 to the horizontal rail member 13 will be explained in detail below with reference to FIG. 3. The first fixture 15 according to a first embodiment of the present invention shown in FIG. 3 comprises a side section 15a abutting against a side surface 10e (side surface of frame 10f) perpendicular to a light-receiving surface 10a of the solar cell module 10, an upper section 15b extending from a top end of the side section 15a so as to face the light-receiving surface 10a of the solar cell module 10, and a lower section 15c extending from a bottom end of the side section 15a so as to face a bottom surface 10d at an opposite side to the light-receiving surface 10a of the solar cell module 10. The lower section 15c abuts against the top surface of a top side horizontal extending section 13a of the horizontal rail member 13. The upper section 15b, side section 15a, and lower section 15c of the fixture 15 form a substantially U-shaped holding part. This holding part holds a downflow short side end 10b of the solar cell module 10.

The first fixture 15 according to the first embodiment further has a fixing section 15d for fixing it to the horizontal rail member 13. The fixing section 15d does not extend downward from the bottom end of the side section 15a, that is, a joined part where the side section 15a and the lower section 15c are joined, but extends downward from a position at the front end side of the lower section 15 away from the joined part (right of FIG. 3). For this reason, the side surface 10e of the solar cell module 10 abutting against the side section 15a of the first fixture 15 protrudes to the outside (left of FIG. 3) compared with the side section 13c of the horizontal rail member 13. The first fixture 15 is fixed to the horizontal rail member 13 by a bolt 18 etc. passed through a fastening hole (not shown) provided at the fixing section 15d.

The first fixture 15 according to the first embodiment is formed as explained above. For this reason, when the solar cell module 10 is held by the holding part of the first fixture 15 and is fixed by the first fixture 15 to a horizontal rail member 13, the horizontal rail member 13 is hidden below the solar cell module 10 and cannot be seen if viewed from the light-receiving surface 10a side. Accordingly, rain falling from above will not wet the horizontal rail member 13. Further, the rainwater falling on the light-receiving surface 10a of the solar cell module 10 falls from the downflow short side end 10b along the outer surface of the side section 15a of the first fixture 15; however, the horizontal rail member 13 will not easily wet, since the side section 15a of the first fixture 15 protrudes to the downflow side (left in FIG. 3) more than the horizontal rail member 13.

Therefore, if using the first fixture 15 according to the first embodiment to fix the solar cell module 10 to the horizontal rail member 13, the amount of rainwater wetting the horizontal rail member 13 will be greatly decreased. For this reason, occurrence of corrosion at the horizontal rail member 13 will be suppressed and the durability and lifetime of the horizontal rail member 13 will be improved. Further, the horizontal rail members 13 may be made not only by a steel material, but also by the use of plastic or wood. It is possible to obtain effects similar to the above by the first fixture 15 of the present invention even with horizontal rail members of these materials.

Figure 4:
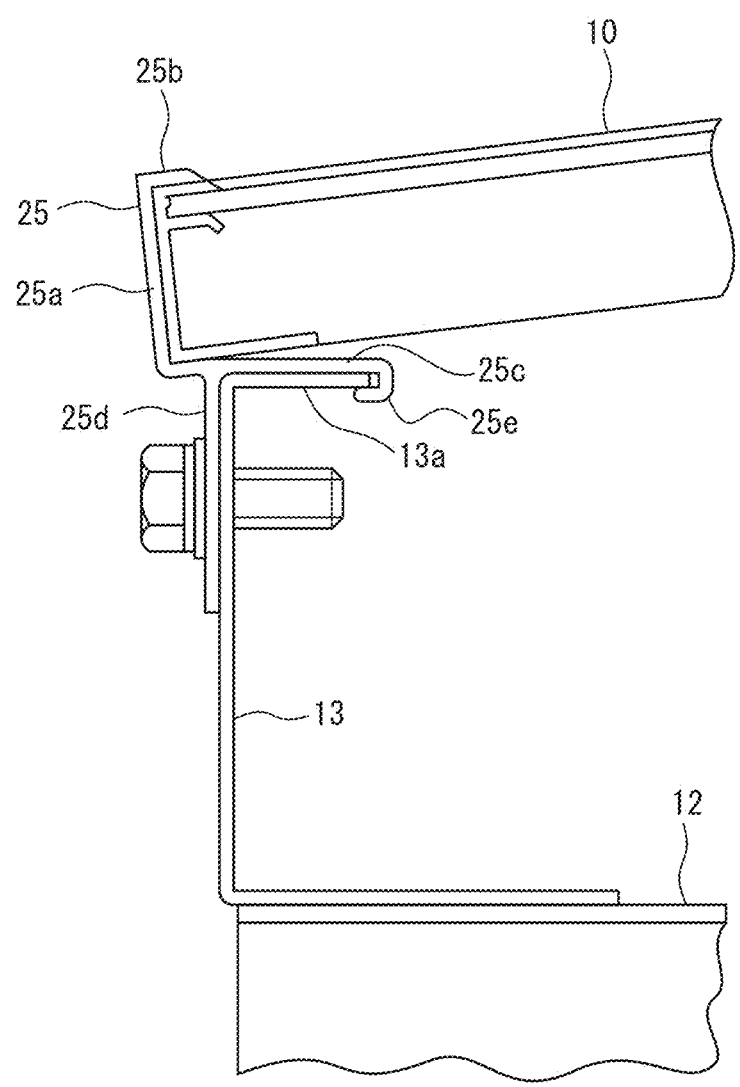
FIG. 4 is a side view showing the state where a fixture according to a second embodiment of the present invention is used to attach a solar cell module to a horizontal rail member of a stand.

Next, a fixture 25 according to a second embodiment will be explained below with reference to FIG. 4. The first fixture 25 according to the second embodiment, like the first fixture 15 according to the first embodiment, has a side section 25a, an upper section 25b, a lower section 25c, and a fixing section 25d. However, it differs from the fixture 15 according to the first embodiment in having a hook 25e engaged with an end of the horizontal extending section 13a of the top side of the horizontal rail member 13 at the front end of the lower section 25c of the first fixture 25. The hook 25e is obtained by forming the tip of the lower section 25c into a U-shape. By making this hook 25e engage with the tip of the horizontal extending section 13a at the top side of the horizontal rail member 13, the effect can be obtained that it is possible to suppress movement of the solar cell module 10 in the vertical direction or horizontal direction due to external force of wind pressure etc. As a result, it becomes possible to more stably hold the solar cell module 10.

Next, a first fixture 35 according to a third embodiment will be explained below with reference to FIG. 5. The fixture 35 according to the third embodiment, in the same way as the fixture 25 according to the second embodiment, has a side section 35a, an upper section 35b, a lower section 35c, a hook 35e, and a fixing section 35d. However, the first fixture 35 differs from the fixture 25 according to the second embodiment in that it further has a first fin 35f, a second fin 35g, and a recess 35h provided at the lower section 35c.

The first fin 35f protrudes from the top end of the side section 35a to the opposite side from the upper section 35b, while the second fin 35g protrudes from the bottom end of the side section 35a downward. In this regard, if there were no first fin 35f, the rainwater flowing from the upflow side of the solar cell module 10 to the upper section 35b of the first fixture 35, while depending on the flow rate, would mostly flow down along the side section 35a. As opposed to this, if there is the first fin 35f, the rainwater flowing from the light-receiving surface of the solar cell module 10 to the upper section 35b will be guided to the first fin 35f and mostly drop off into the air, so this dropping off rainwater is prevented from contacting the horizontal rail member 13.

Figure 5:
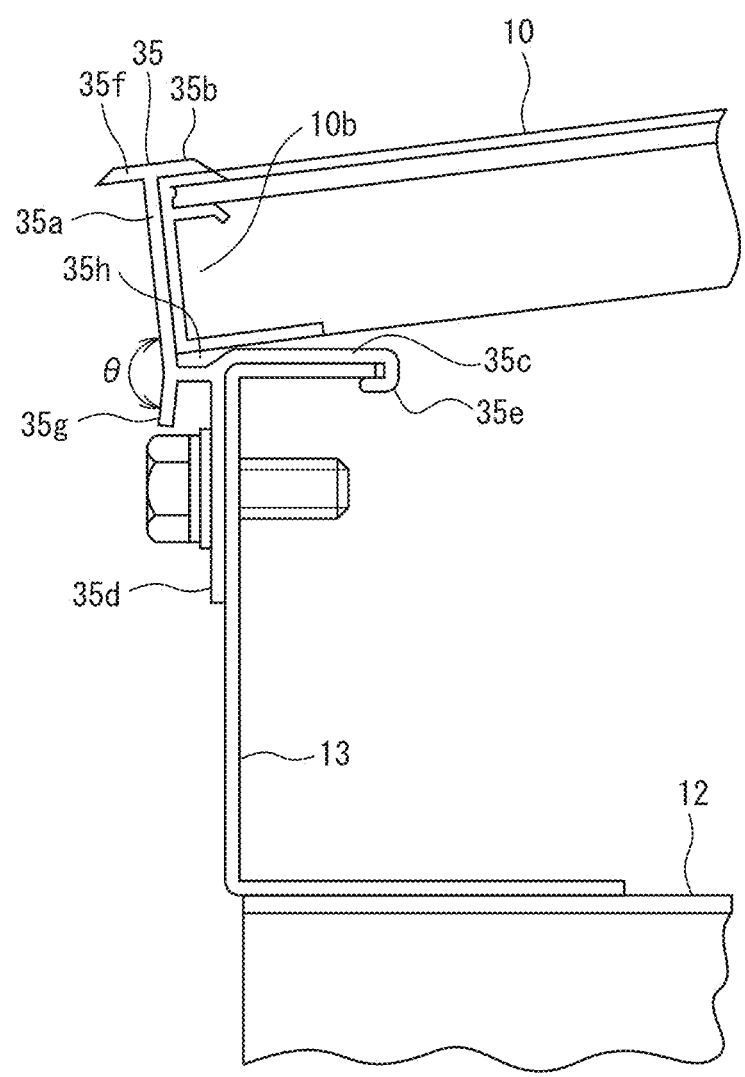
FIG. 5 is a side view showing the state where a fixture according to a third embodiment of the present invention is used to attach a solar cell module to a horizontal rail member of a stand.

The second fin 35g, as shown in FIG. 5, is formed so as to extend the side section 35a, preferably is formed so as to form an included angle □ of less than 180 degrees with the side section 35a. The rainwater flowing along the side section 35a drops off along the second fin 35 and does not flow to the horizontal rail member 13, so wetting of the horizontal rail member 13 can be further prevented.

The recess 35h is formed at least at part of the lower section 35c facing the upper section 35b so that a cavity is formed between the bottom surface 10d at the downflow short side end 10b of the solar cell module 10 and the top surface of the lower section 35c of the fixture 35. By providing this recess 35h, at the time of the installation work, it becomes easy to insert the solar cell module 10 into the holding part from above at a slant. Further, by forming the recess 35h so as to reach the side section 35a, it becomes easy to hold the solar cell module 10 in a slanted state.

An embodiment combining the first fixture 15 according to the first embodiment with at least one of the first fin 35f, second fin 35g, and recess 35h shown in the first fixture 35 according to the third embodiment is also possible.

The first fixtures 15, 25, and 35 according to the first to third embodiments may be used so as to fix an upflow short side end 10b or long side end 10c of a solar cell module 10.

The first fixture 15 according to the first embodiment shown in FIG. 1 and FIG. 2 is shown as having a length considerably shorter than the length of a short side of a solar cell module 10. However, an embodiment where the first fixture 15 is formed as a long member having a length equal to the short side of the solar cell module 10 or a length equal to the length of the total of the short sides of the lined up plurality of solar cell modules 10 is also possible. The same is true for the fixtures 25 and 35 according to the second and third embodiments.

The present application claims priority based on Japanese Patent Application No. 2016-008216 filed on Jan. 19, 2016. The entire content of that patent application is incorporated by reference in the present application.

REFERENCE SIGN LIST 10. solar cell module
11. stand
12. vertical rail member
13. horizontal rail member
15, 25, 35. first fixture
15a, 25a, 35a. side section
15b, 25b, 35b. upper section
15c, 25c, 35c. lower section
15d, 25d, 35d. fixing section
25e, 35e. hook
35f. first fin
35g. second fin

The invention claimed is:

1. A fixture for fixing a solar cell module to a rail member for supporting the solar cell module, the fixture comprising:
    a side section abutting against a side surface of the solar cell module perpendicular to a light-receiving surface of the solar cell module;
    an upper section extending from a top end of the side section so as to face the light-receiving surface of the solar cell module;
    a lower section extending from a bottom end of the side section so as to face a bottom surface of the solar cell module at an opposite side to the light-receiving surface of the solar cell module; and
    a fixing section to be fixed to a side section of the rail member,
        wherein the fixing section has a flat plate shape and extends downward from a position of the lower section away from a part where the side section and the lower section are joined so that the side section of the fixture protrudes further than the side section of the rail member, and
        the fixing section abuts on the side section of the rail member.

2. The fixture of claim 1, wherein a tip of the lower section, which is arranged opposite to the side section with respect to the section where the side section and the rail member are joined, is provided with a hook engaging with a part of the rail member.

3. The fixture of claim 1, further comprising a first fin, which has a flat plate shape and protrudes from the section where the top end of the side section and the upper section are joined to an opposite side from the upper section.

4. The fixture of claim 1, further comprising a second fin which has flat plate shape and protruding from the section where the bottom end of the side section and the lower section are joined to an opposite side from the side is provided.

5. The fixture of claim 1, wherein a surface of the lower section facing the solar cell module is provided with a recess at least at part of the part facing the upper section.

6. The fixture of claim 1, wherein said fixing section is provided with a hole for passing through a bolt by which said fixing section and the side section of the rail member are fixed.

7. The fixture of claim 1, wherein a section of the lower section is arranged on the rail member.

* * * * *